(12) United States Patent
Kato

(10) Patent No.: US 7,214,267 B2
(45) Date of Patent: May 8, 2007

(54) SILICON SINGLE CRYSTAL AND METHOD FOR GROWING SILICON SINGLE CRYSTAL

(75) Inventor: Koji Kato, Tokyo (JP)

(73) Assignee: Sumitomo Mitsubishi Silicon, Tokyo (JP)

(*) Notice: Subject to any disclaimer, the term of this patent is extended or adjusted under 35 U.S.C. 154(b) by 339 days.

(21) Appl. No.: 10/845,322

(22) Filed: May 12, 2004

(65) Prior Publication Data

US 2005/0252442 A1  Nov. 17, 2005

(51) Int. Cl.
*C30B 15/04* (2006.01)

(52) U.S. Cl. .............................. 117/13; 117/15; 117/20; 117/932; 423/348

(58) Field of Classification Search ................. 117/13, 117/15, 20, 932; 423/348
See application file for complete search history.

(56) References Cited

U.S. PATENT DOCUMENTS 4,572,729 A * 2/1986 Lang et al. ................... 65/17.3
5,720,861 A * 2/1998 Kaneko et al. .......... 204/192.2

FOREIGN PATENT DOCUMENTS

JP    2003-137687 A1    5/2003

OTHER PUBLICATIONS

Patent Abstracts of Japan for JP2003-137687 published on May 14, 2003.

* cited by examiner

*Primary Examiner*—Robert Kunemund
(74) *Attorney, Agent, or Firm*—Darby & Darby

(57) ABSTRACT

A silicon single crystal and a method for growing a silicon single crystal are provided. A p-type silicon single crystal is grown with a uniform resistivity value in a pulling direction. Pulling is conducted by the Czochralski method from molten silicon obtained by adding phosphorus to an initial melt in an amount equivalent to 25~35% of an absolute concentration (atoms/cc) of boron contained in the melt.

9 Claims, 5 Drawing Sheets

SILICON SINGLE CRYSTAL AND METHOD FOR GROWING SILICON SINGLE CRYSTAL

BACKGROUND OF THE INVENTION

1. Field of the Invention

The present invention relates to a method for growing a p-type silicon single crystal for silicon wafers used as semiconductor materials, more particularly to a method for growing a silicon single crystal with excellent yield which makes it possible to obtain a larger number of silicon wafers with a required resistivity value in the longitudinal direction of a rod-like single crystal.

2. Description of the Prior Art

When a silicon single crystal having a desired resistivity is grown by the Czochralski method, a segregation coefficient inherent to the substance and determined by the type of silicon and additives has to be taken into account. Because the resistivity typically decreases toward the rear part of the single-crystal ingot that has been pulled, when the desired resistivity range is comparatively narrow, there are portions of the ingot with a resistivity outside this desired range and those portions cannot be used as products.

Various methods for adding n-type impurities have been suggested as methods for eliminating the effect of p-type impurities such as boron and increasing the apparent segregation coefficient (Japanese Patent Application Laid-open No. H10-29894, Japanese Patents No. 2804456, 2804455, 2756476). With those methods a large number of wafers with a desired resistivity value can be obtained from a single ingot and the yield can be increased.

With the process for adjusting the resistivity of a single-crystal silicon described in Japanese Patent Application Laid-open No. H10-29894, it is necessary to introduce an additive for suppressing the decrease in resistivity into the bottom portion of a quartz crucible. However, this additive should not be melted during initial melting and a complex method has to be employed for actual implementation of the process. Furthermore, because an additive has to be added to the melt in the course of the crystal growth, certain special tools are required and the process becomes complex.

With the methods described in Japanese Patents No. 2804456 and 2804455, an element (Ga, Sb, or In) capable of decreasing the thermal expansion coefficient in the vicinity of a melting point is added to a Si melt having B or P added thereto, or an element (B or P) capable of increasing the thermal expansion coefficient in the vicinity of a melting point is added to a Si melt having Ga or Sb added thereto and the melt is then pulled, thereby making it possible to grow a single crystal with uniform distribution of impurities in the growth direction.

With the method described in Japanese Patent No. 2756476, the amount of impurities to be added is found with a special computational formula and the amount thus found is added to improve the uniformity of resistivity value in the wafer surface obtained by growing by a CZ or FZ method. However, when pulling is conducted at a high rate upon addition of n-type impurities by the aforementioned method, a portion in which the resistivity value makes a transition from decrease to increase and is inverted sometimes appears in the vicinity of the ingot bottom. Therefore, the required resistivity value of the ingot is difficult to ensure, resistivity values of all the wafers have to be measured in the wafer production process, and the process flow often becomes difficult.

SUMMARY OF THE INVENTION

It is an object of the present invention to provide a method for growing a silicon single crystal, which makes it possible to increase the apparent segregation coefficient by as simple a method as possible, to obtain a uniform resistivity value of a silicon single crystal and to increase the yield with the aim of obtaining silicon wafers with a required resistivity value in the longitudinal direction of a p-type rod-like silicon single crystal containing boron as the main additive.

The inventors have conducted a comprehensive research with the object of finding means for adding an n-type impurity that provides for uniform resistivity value in the longitudinal direction of a silicon single crystal in a method for increasing the apparent segregation coefficient of a p-type silicon single crystal by means of adding n-type impurities. The results obtained demonstrated that the aforementioned object can be attained by a simple method of adding the prescribed quantity of phosphorus to the initial melt. This finding led to the creation of the present invention.

Thus, the present invention provides a method for melting starting material silicon and growing a p-type silicon single crystal containing boron as the main additive by the Czochralski method, wherein phosphorus is added to the initial melt so that the concentration thereof is 25~35% of the absolute concentration (atoms/cc) of boron in the initial melt, that is, phosphorus is added to the initial melt so that the apparent segregation coefficient of boron contained as the main additive is 0.83~0.88.

[Effects of the Invention]

In accordance with the present invention, when a p-type silicon single crystal containing boron as the main additive is grown, the apparent segregation coefficient can be increased by simple means of adding a specific amount of phosphorus, the resistivity value of the silicon single crystal can be made uniform in the longitudinal direction and can be adjusted to the required value, and the yield can be increased.

DETAILED DESCRIPTION OF PREFERRED EMBODIMENTS

Figure 1A:
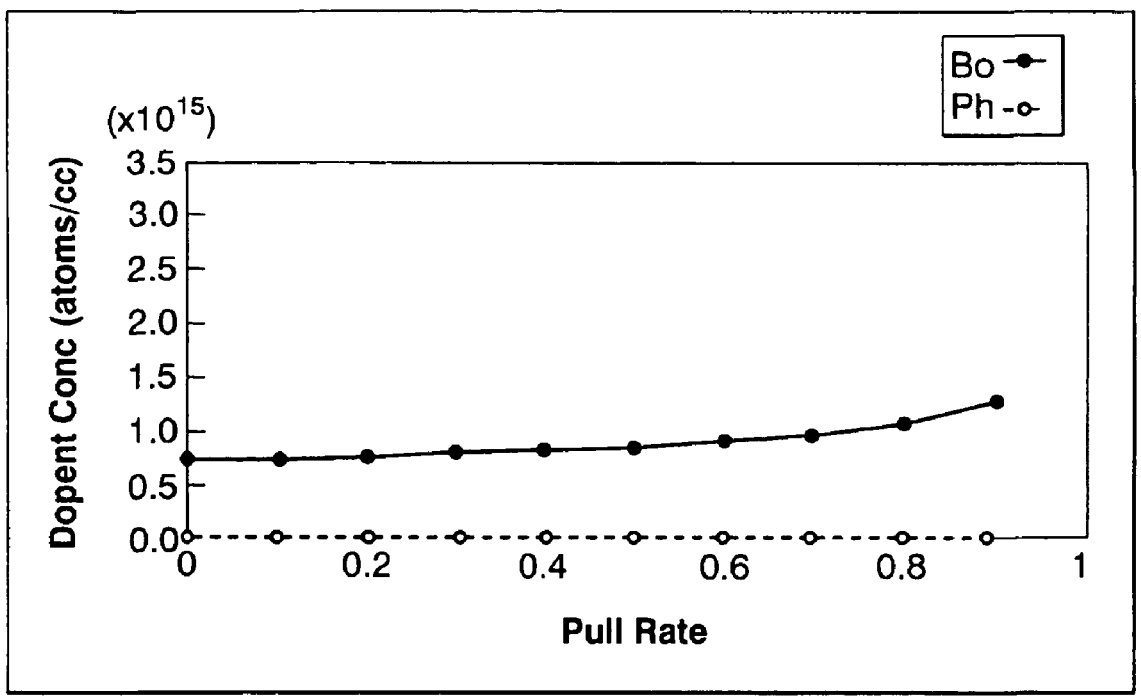
FIG. 1A is a graph showing the concentrations of boron and phosphorus in silicon in each pull rate section obtained when the amount of phosphorus added was 0%.

In accordance with the present invention, if phosphorus is added to the initial melt to a concentration of 25–35% of the absolute concentration of boron (atoms/cc), then the apparent segregation coefficient of boron contained becomes 0.83~0.88, the desired specific resistivity usually can be obtained over almost the entire single crystal which is manufactured, and the effect obtained is that no portion with inverted specific resistivity is formed in the vicinity of the ingot bottom.

Specifically, a specific feature of the present invention is that the resistivity value of the silicon single crystal is uniform in the pulling direction. However, it is desired that the resistivity value tend only to decrease, without a transition from decrease to increase, within the required range such as a range from a target resistivity value to a value within −30% therefrom, in the direction from top to bottom of the single crystal that was pulled, for example, over not more than 90% of the single crystal length.

Further, the apparent segregation coefficient of boron is a segregation coefficient found from the resistivity value and the measurement position thereof, under an assumption that only boron is present. Boron and phosphorus present in silicon demonstrate mutually independent segregation. If absolute amounts of boron and phosphorus are measured, for example, by photoluminescence and respective segregation coefficients are found, then values close to 0.75 and 0.35 are obtained when C boron>>C phosphorus and also when C boron>C phosphorus. However, if a segregation coefficient is found from the resistivity value and measurement position thereof, then holes generated by boron and electrons generated by phosphorus will be mutually annihilated and segregation coefficients different from the above-mentioned values will be obtained. In this case it is assumed that the boron alone is present. More specifically, when C boron>>>C phosphorus, the number of holes is overwhelmingly large and, therefore, a value close to 0.75 is obtained. However, when C boron>C phosphorus, the number of vacancies becomes close to the number of electrons (especially, in the rear half of the crystal), the number of holes eliminated by the electrons cannot be ignored, and if the segregation coefficient is found from the resistivity value and the measurement position thereof, a value larger than 0.75 is obtained.

In accordance with the present invention, phosphorus is added to the initial melt to a concentration of 25~35% of the absolute boron concentration (atoms/cc) therein. If the phosphorus concentration is less than 25%, the apparent segregation coefficient of boron becomes 0.83 or less, a range in which the desired resistivity value can be obtained is limited and the addition of phosphorus hardly demonstrates any effect. If the concentration exceeds 35%, the apparent segregation coefficient of boron becomes 0.88 or higher and the desired resistivity value can be obtained almost over the entire range. However, the undesirable consequence is that a portion with inverted resistivity or a portion corresponding thereto appears in the vicinity of the ingot bottom.

Specifically, the segregation coefficient of boron is about 0.75, the segregation coefficient of phosphorus is about 0.35, and the lower is the segregation coefficient the lower is the concentration of impurities introduced in the single crystal. This means that the lower is the segregation coefficient, the higher is the degree of concentration of the impurities in the melt. When the concentrations of boron and phosphorus become close to each other, the increase in phosphorus concentration in the vicinity of ingot bottom cannot be ignored.

In the usual case in which the concentration of boron is not close to the concentration of phosphorus (C boron>>C phosphorus), the concentrations of boron and phosphorus increase toward the bottom. Furthermore, because the difference between the concentration of boron and the concentration of phosphorus is high, the segregation coefficient is not changed. However, when the concentrations of boron and the concentration of phosphorus become close, in particular, when they become close with C boron being more than C phosphorus, the apparent segregation coefficient changes. At this time, both the concentration of boron and the concentration of phosphorus increase toward the bottom, but if the increase in phosphorus concentration exceeds that of boron concentration, the apparent segregation coefficient of boron locally becomes negative and a resistivity inversion effect occurs. Therefore, a specific optimum value exists for certain types of combinations of impurities.

In accordance with the present invention, no limitations are placed on pulling conditions in the Czochralski method, but it is preferred that the absolute boron concentration in the initial melt be $2.7 \times 10^{16}$ atoms/cc or less.

[Embodiments]

COMPARATIVE EXAMPLE 1

A total of 140 kg of silicon was melted and growth was conducted by adding a dopant comprising boron in an equivalent amount of $5.77 \times 10^{19}$ atoms/cc with the object of growing a p-type 8-inch single crystal with a resistivity of 15~20 Ωcm.

Figure 1B:
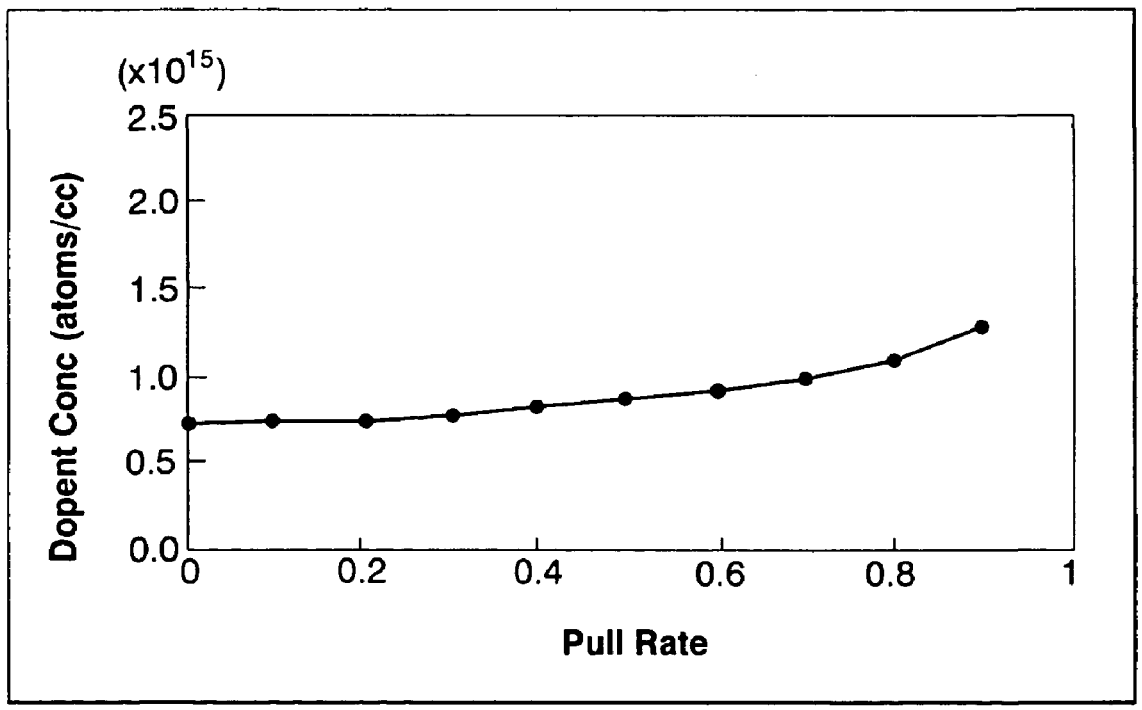
FIG. 1B is a graph showing the difference in the concentration between boron and phosphorus in the same each pull rate section.
Figure 1C:
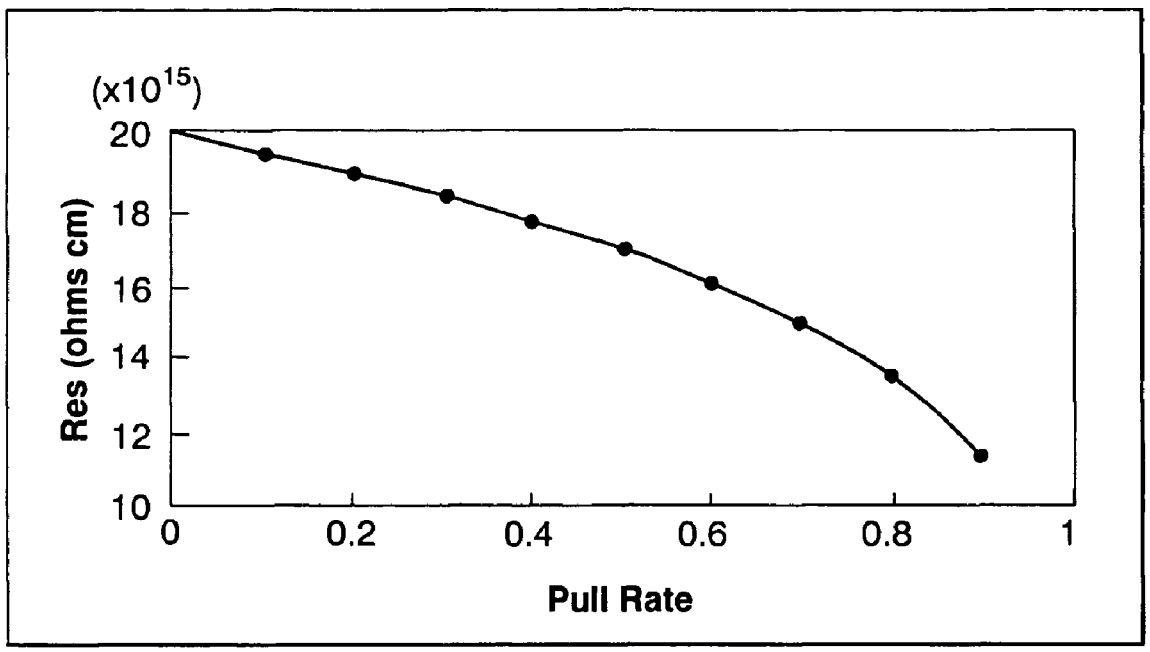
FIG. 1C is a graph showing the resistivity value in the same each pull rate section.

The concentrations of boron and phosphorus in silicon in each pull rate section are shown in FIG. 1A, the difference in the concentration between boron and phosphorus is shown in FIG. 1B, and the resistivity value in each pull rate section is shown in FIG. 1C. The results obtained show that the desired resistivity value could be obtained only in 70% of the entire body. Furthermore, the segregation coefficient of boron with respect to silicon was 0.75.

COMPARATIVE EXAMPLE 2

Figure 3A:
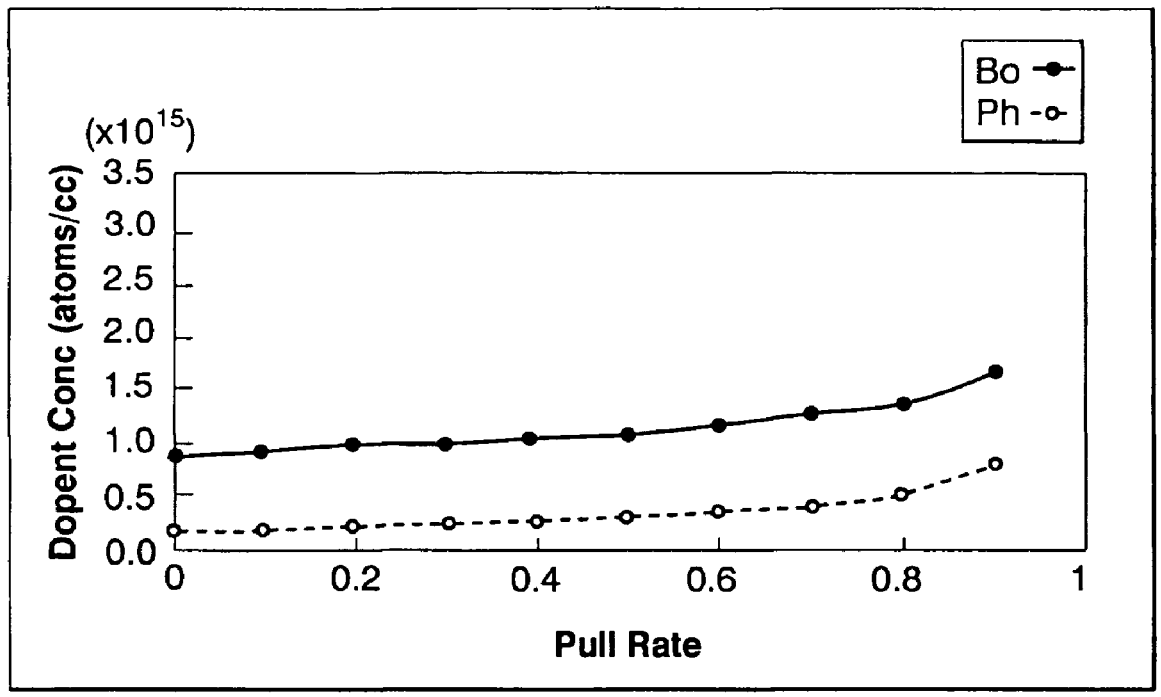
FIG. 3A is a graph showing the concentrations of boron and phosphorus in silicon in each pull rate section obtained when the amount of phosphorus added was 40%.
Figure 3B:
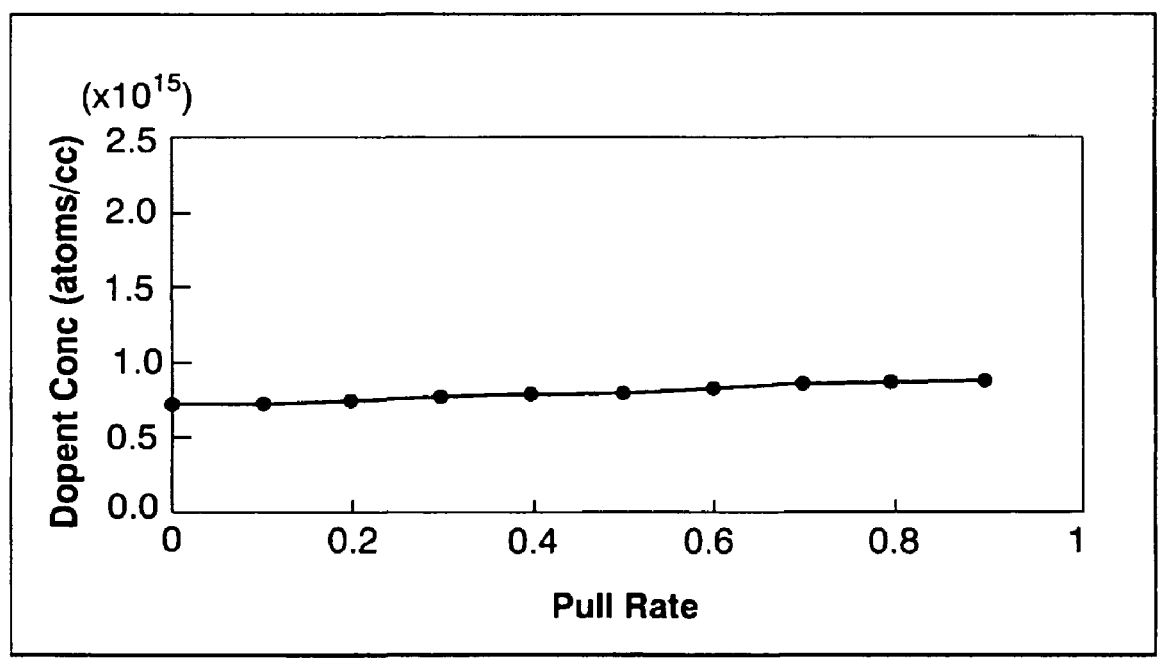
FIG. 3B is a graph showing the difference in the concentration between boron and phosphorus in the same each pull rate section.
Figure 3C:
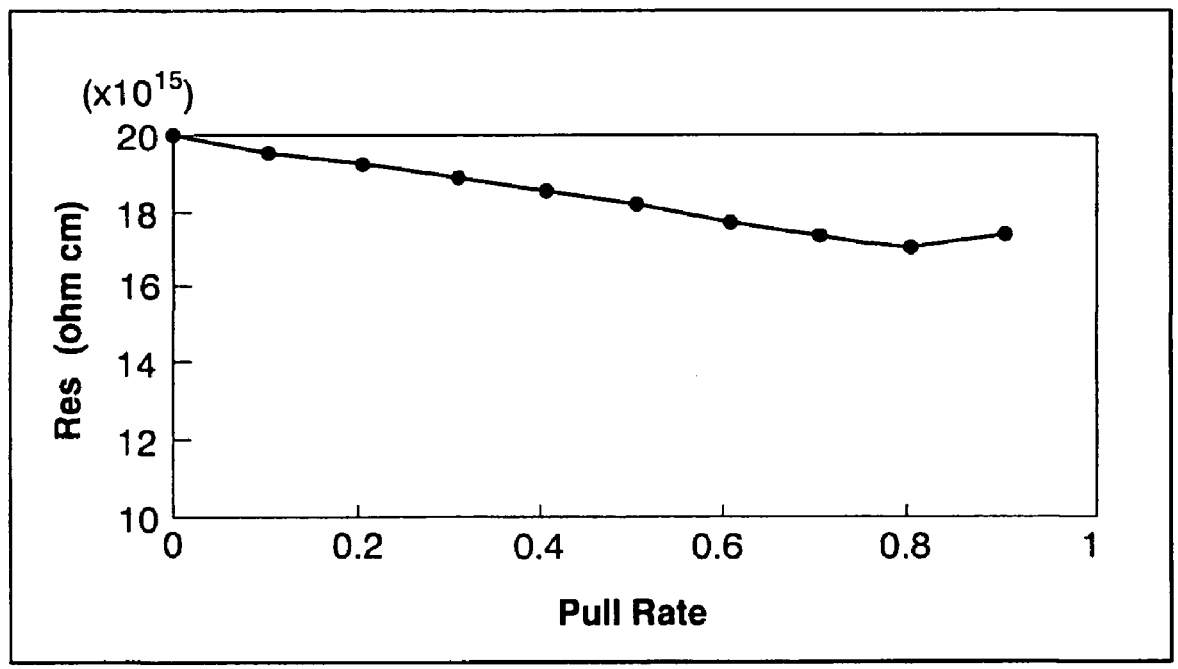
FIG. 3C is a graph showing the resistivity value in the same each pull rate section.

In melting 140 kg of silicon and growing a p-type 8-inch single crystal with a resistivity of 15~20 Ωcm in a similar way as in Comparative Example 1, when phosphorus was added in an amount of 40% of the absolute boron concentration (atoms/cc) in the initial solution, the desired resistivity value could be obtained in 100% of the entire body, as shown by the concentrations of boron and phosphorus, the difference in the concentration between boron and phosphorus, and the resistivity value in FIG. 3, but a portion with inverted resistivity value appeared in the vicinity of ingot bottom.

Embodiment 1

When melting 140 kg of silicon and growing a p-type 8-inch single crystal with a resistivity of 15~20 Ωcm in a similar way as in Comparative Example 1, pulling was conducted upon adding phosphorus at 31% of the absolute boron concentration (atoms/cc) in the initial solution.

Figure 2A:
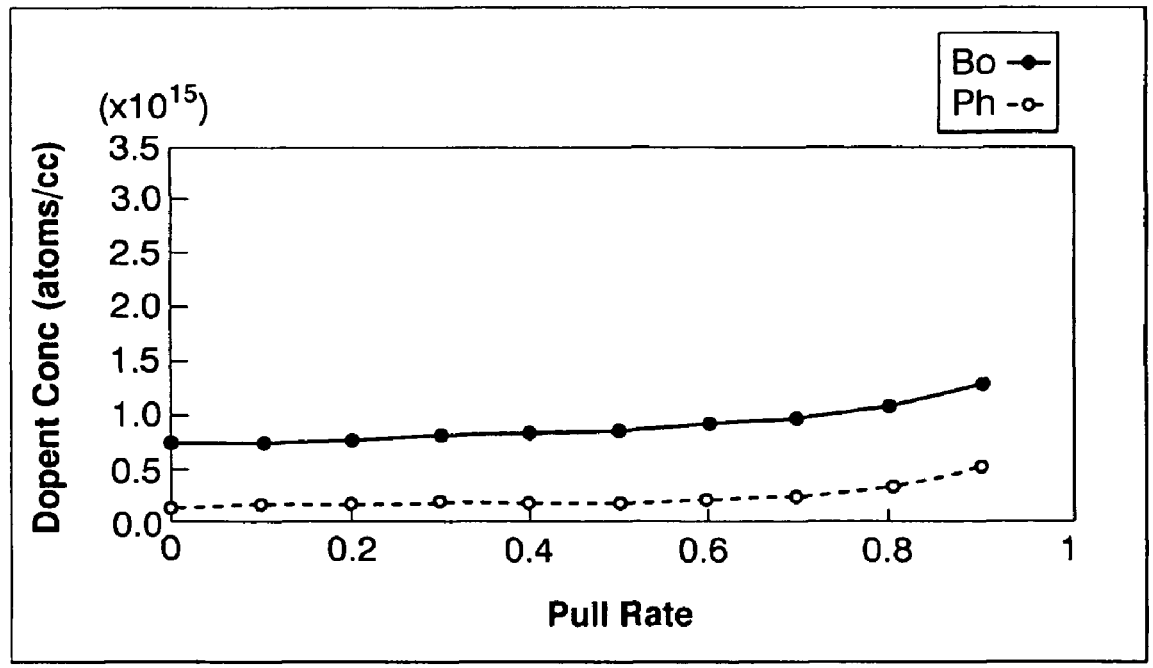
FIG. 2A is a graph showing the concentrations of boron and phosphorus in silicon in each pull rate section obtained when the amount of phosphorus added was 31%.
Figure 2B:
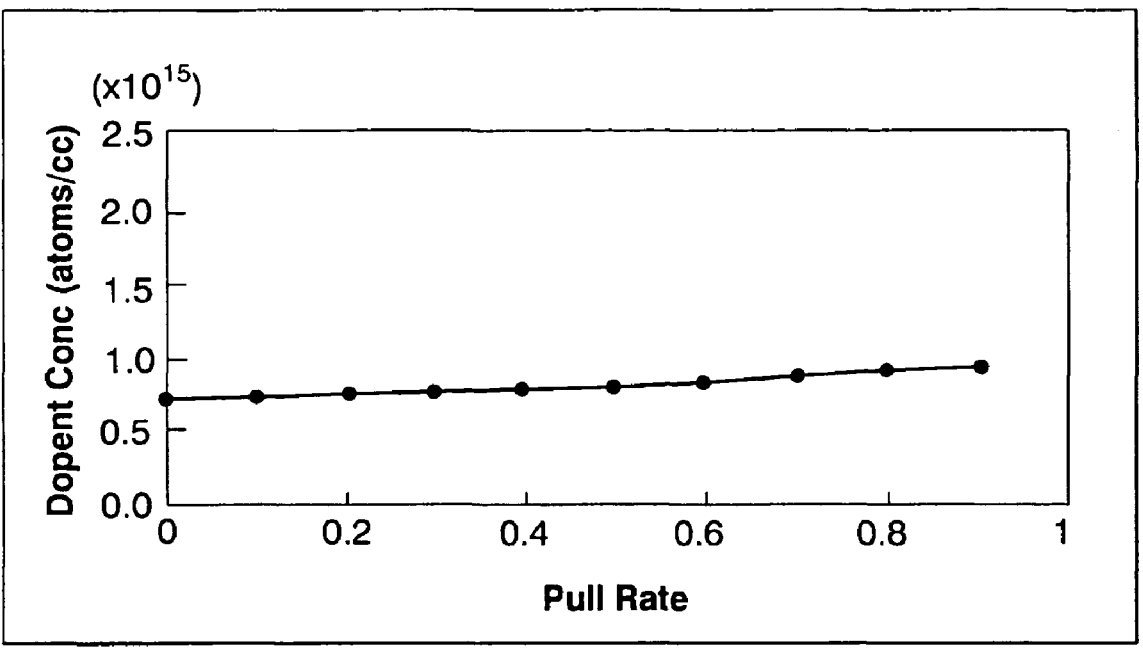
FIG. 2B is a graph showing the difference in the concentration between boron and phosphorus in the same each pull rate section.
Figure 2C:
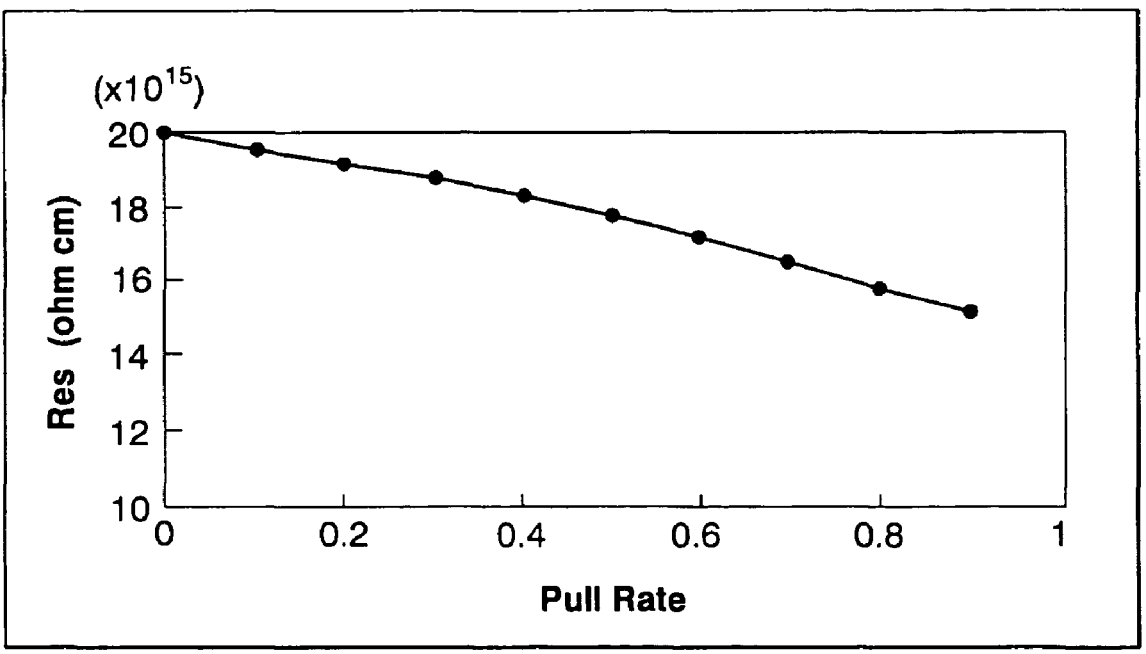
FIG. 2C is a graph showing the resistivity value in the same each pull rate section.

As a result, as shown by the concentrations of boron and phosphorus, the difference in the concentration between boron and phosphorus, and the resistivity value in FIG. 2, the desired resistivity value could be obtained in 90% of the entire body. Furthermore, the segregation coefficient of boron in silicon containing no phosphorus was 0.75, but when 31% phosphorus was added, the segregation coefficient became 0.85.

What is claimed is:

1. A method for growing a silicon single crystals comprising the step of:

growing a p-type silicon single crystal with a uniform resistivity value in a pulling direction by the Czochralski method from molten silicon obtained by adding phosphorus to an initial melt in an amount equivalent to 25~35% of an absolute concentration (atoms/cc) of boron contained as a main additive therein.

2. The method for growing a silicon single crystal according to claim 1, wherein the phosphorous concentration of 25~35% of the absolute concentration (atoms/cc) of boron corresponds to an apparent boron segregation coefficient of 0.83~0.88.

3. The method for growing a silicon single crystal according to claim 1, wherein the resistivity value of the silicon single crystal is within −30% from a target resistivity value at 90% or more in a longitudinal direction of the silicon single crystal and shows a tendency of decreasing in the pulling direction.

4. The method for growing a silicon single crystal according to claim 1, wherein pulling conditions in the Czochralski method are such that the absolute boron concentration of the initial melt is $2.7 \times 10^{16}$ atoms/cc or less.

5. A method for growing a silicon single crystal, comprising the steps of:

melting silicon to create an initial silicon melt;

adding boron to the intial silicon melt;

adding phosphorus to the initial silicon melt in an amount equivalent to approximately 25~35% of an absolute concentration (atoms/cc) of boron contained as an additive in the silicon melt; and pulling a p-type silicon single crystal with a uniform resistivity value out from the resultant silicon melt by the Czochralski method.

6. The method according to claim 5, wherein boron is added to the intial silicon melt to achieve the absolute boron concentration of approximately $2.7 \times 10^{16}$ atoms/cc or less.

7. A silicon melt for producing a silicon single crystal, comprising:

melted silicon;

boron with an absolute boron concentration of approximately $2.7 \times 10^{16}$ atoms/cc or less in the melted silicon; and phosphorous in an amount equivalent to approximately 25×35% of the absolute concentration (atoms/cc) of boron in the melted silicon.

8. A silicon single crystal having a resistivity value within −30% from a target resistivity value at 90% or more in a longitudinal direction of the silicon single crystal and the resistivity value tending to decrease in a pulling direction according to the Czochralski method.

9. The silicon single crystal according to claim 8, wherein the silicon single crystal is characterized with an apparent boron segregation coefficient of 0.83×0.88.

* * * * *

UNITED STATES PATENT AND TRADEMARK OFFICE
CERTIFICATE OF CORRECTION

PATENT NO.        : 7,214,267 B2
APPLICATION NO.   : 10/845322
DATED             : May 8, 2007
INVENTOR(S)       : Koji Kato It is certified that error appears in the above-identified patent and that said Letters Patent is hereby corrected as shown below:

On Title Page
In the Assingee:

Item 73
Please delete "Sumitomo Mitsubishi Silicon, Tokyo (JP)" and substitute with --Sumitomo Mitsubishi Silicon Corporation, Tokyo (JP)--.

Signed and Sealed this

Eleventh Day of September, 2007

JON W. DUDAS
*Director of the United States Patent and Trademark Office*